US008889465B2

(12) United States Patent
Wieting

(10) Patent No.: US 8,889,465 B2
(45) Date of Patent: *Nov. 18, 2014

(54) SODIUM DOPED THIN FILM CIGS/CIGSS ABSORBER FOR HIGH EFFICIENCY PHOTOVOLTAIC DEVICES AND RELATED METHODS

(71) Applicant: Stion Corporation, San Jose, CA (US)

(72) Inventor: Robert D. Wieting, Simi Valley, CA (US)

(73) Assignee: Stion Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/857,229

(22) Filed: Apr. 5, 2013

(65) Prior Publication Data

US 2014/0134785 A1    May 15, 2014

Related U.S. Application Data

(63) Continuation of application No. 13/308,023, filed on Nov. 30, 2011, now Pat. No. 8,436,445.

(60) Provisional application No. 61/523,802, filed on Aug. 15, 2011.

(51) Int. Cl.
| | | |
|---|---|---|
| *H01L 31/18* | (2006.01) | |
| *H01L 31/032* | (2006.01) | |
| *H01L 31/0392* | (2006.01) | |

(52) U.S. Cl.
CPC ............ *H01L 31/18* (2013.01); *H01L 31/0322* (2013.01); *H01L 31/0323* (2013.01); *H01L 31/03923* (2013.01); *Y02E 10/541* (2013.01)
USPC ................................ 438/84; 438/87; 136/262

(58) Field of Classification Search
USPC ............... 438/84, 87; 136/262, 264; 257/463, 257/E27.123, E21.072
See application file for complete search history.

(56) References Cited

U.S. PATENT DOCUMENTS

| | | | | |
|---|---|---|---|---|
| 8,436,445 | B2 * | 5/2013 | Wieting .......................... | 257/463 |
| 2008/0035199 | A1 * | 2/2008 | Kume et al. .................... | 136/264 |
| 2010/0218827 | A1 * | 9/2010 | Aono et al. ..................... | 136/264 |
| 2011/0083743 | A1 * | 4/2011 | Yamamoto ...................... | 136/262 |
| 2011/0139251 | A1 * | 6/2011 | Robinson et al. .............. | 136/262 |
| 2012/0180870 | A1 * | 7/2012 | Yamamoto ...................... | 136/262 |
| 2012/0264255 | A1 * | 10/2012 | Grand et al. .................... | 438/84 |
| 2013/0037111 | A1 * | 2/2013 | Mitzi et al. ..................... | 136/264 |
| 2013/0309805 | A1 * | 11/2013 | Liang et al. ..................... | 438/87 |
| 2013/0316519 | A1 * | 11/2013 | Mitzi et al. ..................... | 438/478 |

* cited by examiner

*Primary Examiner* — George Fourson, III
(74) *Attorney, Agent, or Firm* — Kilpatrick Townsend & Stockton LLP

(57) ABSTRACT

A method of processing a thin-film absorber material with enhanced photovoltaic efficiency. The method includes providing a soda-lime glass substrate having a surface region and forming a barrier material overlying the surface region, followed by formation of a stack structure including a first thickness of a first precursor, a second thickness of a second precursor, and a third thickness of a third precursor. The first thickness of the first precursor is sputtered with a first target device including a first mixture of copper, gallium, and a first sodium species. The method further includes subjecting the soda-lime glass substrate having the stack structure in a thermal treatment process with at least $H_2Se$ gas species at a temperature above 400° C. to cause formation of an absorber material. Moreover, the method includes transferring a second sodium species from a portion of the soda-lime glass substrate via gas-phase diffusion during the thermal treatment process.

14 Claims, 8 Drawing Sheets

SODIUM DOPED THIN FILM CIGS/CIGSS ABSORBER FOR HIGH EFFICIENCY PHOTOVOLTAIC DEVICES AND RELATED METHODS

CROSS-REFERENCES TO RELATED APPLICATIONS

This application is a continuation of U.S. patent application Ser. No. 13/308,023, filed on Nov. 30, 2011 and claims priority to U.S. Provisional Patent Application No. 61/523,802, filed on Aug. 15, 2011, commonly assigned, and hereby incorporated by reference in its entirety herein for all purpose.

BACKGROUND OF THE INVENTION

The present invention relates generally to thin-film photovoltaic materials and manufacturing method. More particularly, the present invention provides a method for the manufacture of thin-film photovoltaic absorber materials. Merely by way of example, the present method includes sodium doping pathways for the formation of a CIGS/CIGSS-based absorber material for high efficiency photovoltaic devices, but it would be recognized that the invention may have other configurations.

From the beginning of time, mankind has been challenged to find way of harnessing energy. Energy comes in the forms such as petrochemical, hydroelectric, nuclear, wind, biomass, solar, and more primitive forms such as wood and coal. Over the past century, modern civilization has relied upon petrochemical energy as an important energy source. Petrochemical energy includes gas and oil. Gas includes lighter forms such as butane and propane, commonly used to heat homes and serve as fuel for cooking. Gas also includes gasoline, diesel, and jet fuel, commonly used for transportation purposes. Heavier forms of petrochemicals can also be used to heat homes in some places. Unfortunately, the supply of petrochemical fuel is limited and essentially fixed based upon the amount available on the planet Earth. Additionally, as more people use petroleum products in growing amounts, it is rapidly becoming a scarce resource, which will eventually become depleted over time.

More recently, environmentally clean and renewable sources of energy have been desired. An example of a clean source of energy is hydroelectric power. Hydroelectric power is derived from electric generators driven by the flow of water produced by dams such as the Hoover Dam in Nevada. The electric power generated is used to power a large portion of the city of Los Angeles in California. Clean and renewable sources of energy also include wind, waves, biomass, and the like. That is, windmills convert wind energy into more useful forms of energy such as electricity. Still other types of clean energy include solar energy. Specific details of solar energy can be found throughout the present background and more particularly below.

Solar energy technology generally converts electromagnetic radiation from the sun to other useful forms of energy. These other forms of energy include thermal energy and electrical power. For electrical power applications, solar cells are often used. Although solar energy is environmentally clean and has been successful to a point, many limitations remain to be resolved before it becomes widely used throughout the world. As an example, one type of solar cell uses crystalline materials, which are derived from semiconductor material ingots. These crystalline materials can be used to fabricate optoelectronic devices that include photovoltaic and photodiode devices that convert electromagnetic radiation into electrical power. However, crystalline materials are often costly and difficult to make on a large scale. Additionally, devices made from such crystalline materials often have low energy conversion efficiencies. Other types of solar cells use "thin film" technology to form a thin film of photosensitive material to be used to convert electromagnetic radiation into electrical power. Similar limitations exist with the use of thin film technology in making solar cells. That is, efficiencies for thin-film photovoltaic cells based on various types of absorber materials are often relative poor. Additionally, some film ingredients such as sodium species were found to be helpful for enhancing grain formation of copper based photovoltaic absorber material but also found harmful of the integration of electrode materials associated with the device, especially for large scale manufacture. How to incorporate the right doping ingredient into thin films through one or more process pathways with a desired concentration for the formation of thin-film absorber materials with enhanced photovoltaic efficiency was still largely unknown. These and other limitations of these conventional technologies can be found throughout the present specification and more particularly below.

BRIEF SUMMARY OF THE INVENTION

The present invention relates generally to thin-film photovoltaic materials and manufacturing method. More particularly, the present invention provides a method for the manufacture of thin-film photovoltaic absorber materials. Merely by way of example, the present method includes sodium doping pathways for the formation of a CIGS/CIGSS-based absorber material for thin-film photovoltaic devices with enhanced efficiency, but it would be recognized that the invention may have other configurations.

In a specific embodiment, the present invention provides a method of processing a thin film absorber material with enhanced photovoltaic efficiency. The method includes providing a soda lime glass substrate having a surface region and forming a barrier material overlying the surface region. The barrier material is configured to prevent a diffusion of a second sodium ion from the soda lime glass substrate. The method further includes forming an electrode material comprising a molybdenum material overlying the barrier material. Additionally, the method includes sputtering a first target device including a first mixture of a copper species, gallium species, and a first sodium species to form a first thickness of a first precursor material overlying the electrode material. The method further includes sputtering a second target device including a second mixture of a copper species and a gallium species to form a second thickness of a second precursor material overlying the first precursor material and sputtering a third target device including an indium species to form a third thickness of a third precursor material overlying the second precursor material to cause formation of a stack structure including the first thickness, the second thickness, and the third thickness. Furthermore, the method includes subjecting the soda lime glass substrate having the stack structure in a thermal treatment process with $H_2Se$ gas species and nitrogen species at a temperature above 400° C. to cause formation of an absorber material from interdiffusion of the copper species, the gallium species, the indium species, and the first sodium species. Moreover, the method includes transferring a second sodium species from a portion of the soda lime glass substrate via gas-phase diffusion during a portion of time associated with the thermal treatment process.

In another specific embodiment, the present invention provides a method of incorporating sodium species into thin-film photovoltaic absorber for enhancing solar energy conversion efficiency. The method includes providing a first soda lime glass substrate having a front surface region and a back surface region and forming a bottom electrode material overlying the front surface region. The method further includes forming a stack of precursor materials including copper species, indium species, gallium species, and a first sodium species, overlying the electrode material at a first temperature range. Additionally, the method includes disposing the first soda lime glass substrate having the stack of precursor materials to a furnace containing $H_2Se$ gas species and nitrogen gas species. Furthermore, the method includes disposing at least a second soda lime glass substrate to the same furnace to have its back surface region within a substantially close distance facing the stack of precursor materials on the first soda lime glass substrate. The second soda lime glass substrate is substantially the same as the first soda lime glass substrate. Moreover, the method includes subjecting the first glass substrate having the stack of precursor materials and the at least second soda lime glass substrate to a thermal process in the furnace at a second temperature range to cause the precursor materials reacting with selenium species from the $H_2Se$ gas species to form a photovoltaic absorber material having the first sodium species incorporated therein, and further to cause a second sodium species diffusing out of the back surface region of the second soda lime glass substrate, passing through the substantially close distance, incorporating into the photovoltaic absorber material on the first soda lime glass substrate.

Many benefits can be achieved by applying the embodiments of the present invention. Particularly, a sodium doping process serves an important step for forming copper based chalcopyrite structured high efficiency photovoltaic material. The present invention provides a first pathway of the sodium doping using an in-chamber sputtering process. The process allows a use of target device with pre-controlled sodium concentration in a formation of a stack of precursor materials. The method simplifies the doping process to perform one or more sputtering processes that cause the formation of a first thickness of copper, gallium, and sodium composite material, followed by a second thickness of copper and gallium composite material, then a third thickness of primary indium material as the precursor stack of materials. The target devices for copper-gallium or indium materials can also be respectively selected with a pre-determined composition ratio. The method further includes a thermal treatment process within a predetermined chemical environment including gaseous selenium and sulfur species to cause interdiffusion of sodium species and reaction of copper, gallium and indium with selenium and sulfur species. Through a multi-substrate in-parallel layout in the furnace during the thermal treatment, a second sodium species is extracted out of any a back surface region of a soda lime glass substrate during the same thermal treatment process and transferred via a gas phase diffusion into the stack of precursor materials on a front surface region of a neighboring substrate. Under a pre-determined temperature profile over a controlled period of treatment time, the stack of precursor materials is transformed to a thin-film photovoltaic absorber material with desirable ingredient of sodium doping level and copper-to-indium-gallium composition ratio. Based on the as-formed thin-film photovoltaic absorber material, monolithically integrated solar modules with high efficiency of about 15% or higher are formed directly on the soda lime glass substrates.

These and other benefits may be described throughout the present specification and more particularly below.

DETAILED DESCRIPTION OF THE INVENTION

The present invention relates generally to thin-film photovoltaic materials and manufacturing method. More particularly, the present invention provides a method for fabricating a sodium-doped precursor for forming photovoltaic absorber materials. Merely by way of example, the present method illustrates pathways for doping sodium species for forming CIGS/CIGSS thin-film photovoltaic absorber materials used for the manufacture of high efficiency solar devices, but it would be recognized that the invention may have other configurations.

Figure 1:
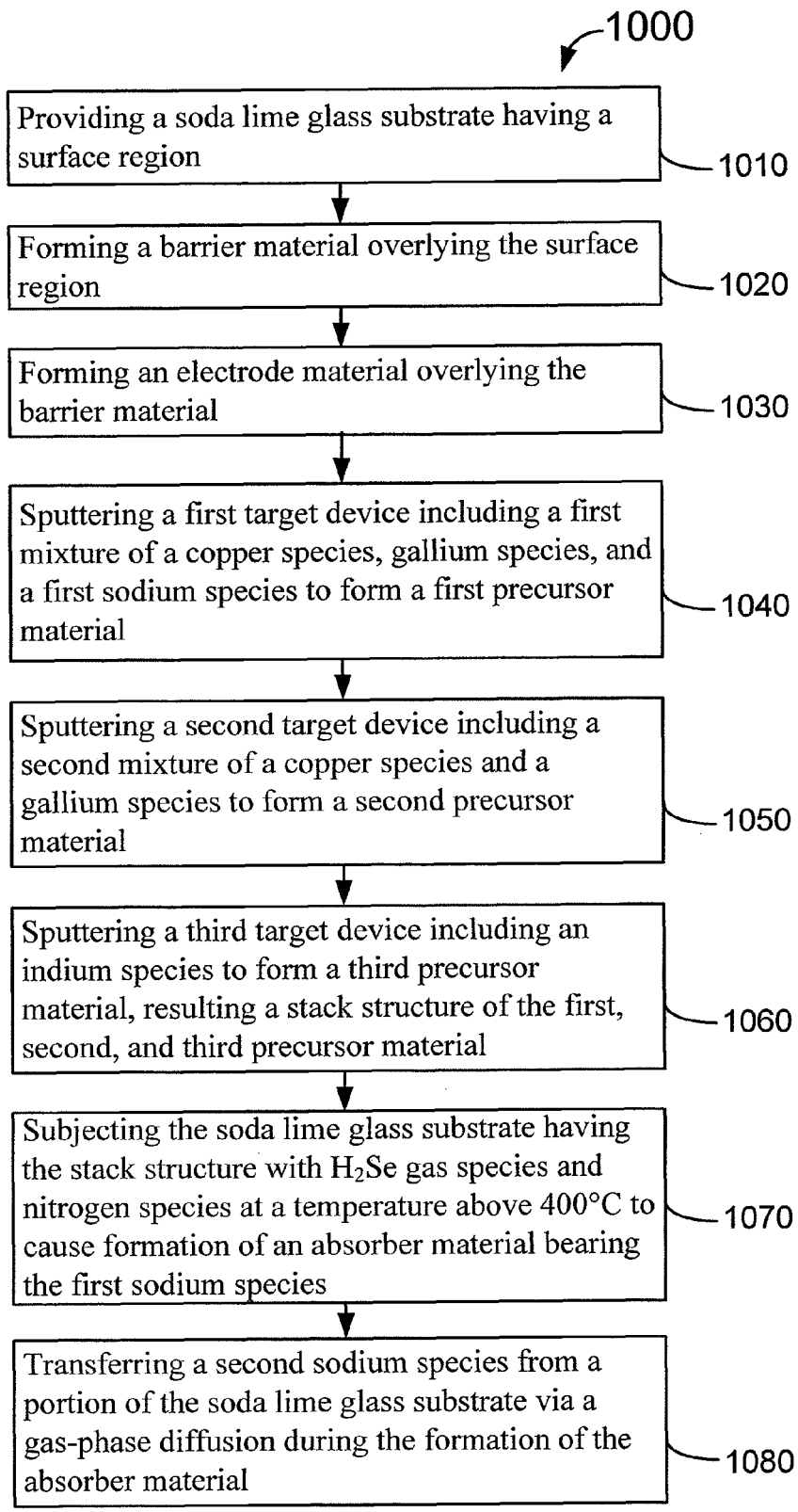
FIG. 1 is a simplified flowchart illustrating a method of fabricating a thin-film photovoltaic absorber material according to an embodiment of the present invention.

FIG. 1 is a simplified flowchart illustrating a method of fabricating a thin-film photovoltaic absorber material according to an embodiment of the present invention. This diagram is merely an example, which should not unduly limit the scope of the claims herein. The method 1000 includes but not limits to the following processes:

1. Process 1010 for providing a soda lime glass substrate having a surface region;
2. Process 1020 for forming a barrier material overlying the surface region;
3. Process 1030 for forming an electrode material overlying the barrier material;
4. Process 1040 for sputtering a first target device including a first mixture of a copper species, gallium species, and a first sodium species to form a first precursor material;
5. Process 1050 for sputtering a second target device including a second mixture of a copper species and a gallium species to form a second precursor material;
6. Process 1060 for sputtering a third target device including an indium species to form a third precursor material, resulting a stack structure of the first, second, and third precursor material;

7. Process 1070 for subjecting the soda lime glass substrate having the stack structure with $H_2Se$ gas species and nitrogen species at a temperature above 400° C. to cause formation of an absorber material bearing the first sodium species;

8. Process 1080 for transferring a second sodium species from a portion of the soda lime glass substrate via a gas-phase diffusion during the formation of the absorber material.

The above sequence of processes provides a method for forming a copper-based chalcopyrite compound photovoltaic absorber material according to an embodiment of the present invention. In a specific embodiment, the method includes at least two pathways for doping sodium species during the formation of the absorber material: 1) an in-chamber sodium sputtering process as a first pathway of doping sodium species into a stack of precursor materials; 2) a gas phase diffusion process as a second pathway of doping sodium species during the chemical treatment of the stack of precursor materials for the formation of the absorber materials with proper stoichiometry. Other alternatives can also be provided where certain processes are added, one or more processes are removed, or one or more processes are provided in a different sequence without departing from the scope of the claims herein. For example, additional thin films including a window material and one or more transparent electrode materials can be formed overlying the just formed photovoltaic absorber material for the manufacture of the high efficiency thin-film photovoltaic devices. Further details of the method can be found throughout the present specification and more particularly below.

Figure 2:
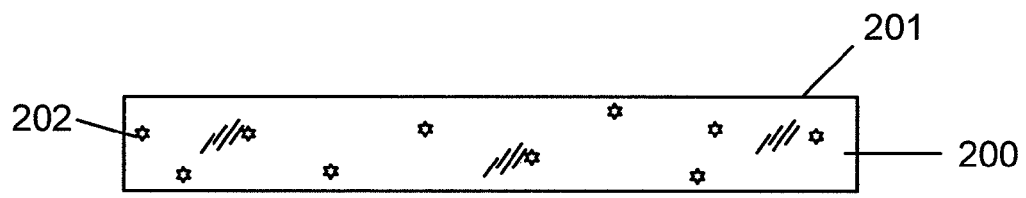
FIGS. 2-9 are schematic diagrams illustrating a method and a structure including sodium doping pathways for fabricating a thin-film photovoltaic absorber material according to one or more embodiments of the present invention.

At Process 1010, a soda lime glass substrate having a surface region is provided. This process can be visually illustrated by FIG. 2. FIG. 2 is a simplified diagram showing that a transparent substrate, specifically a soda lime glass substrate, is provided for fabricating a monolithic thin-film photovoltaic device according to an embodiment of the present invention. This diagram is merely an example, which should not unduly limit the scope of the claims herein. One of ordinary skill in the art would recognize many variations, alternatives, and modifications. As shown, the transparent substrate 200 is soda lime glass having a surface region 201. In an implementation, the substrate 200 is provided with a soda lime window glass with planar shape although other shapes may be applied depending on the applications. The soda lime glass substrate naturally contains alkaline ions 202 (e.g., $Na^+$) within an ingredient of about 14 wt % of $Na_2O$, which provides a source of sodium species. Embodiments of the present invention have been associated with roles of sodium species played in semiconductor films to enlarge coarse grain sizes and to serve as one type of dopants in the photovoltaic cell. However, sodium species also cause unwanted peel off effect of certain metallic films. Thus both stoichiometry control of the sodium doping in the photovoltaic films through one or more pathways and spatial distribution control in the stacks of films play important roles in the thin-film photovoltaic devices to enhance performance. More details can be found throughout the specification and specifically below.

Figure 3:
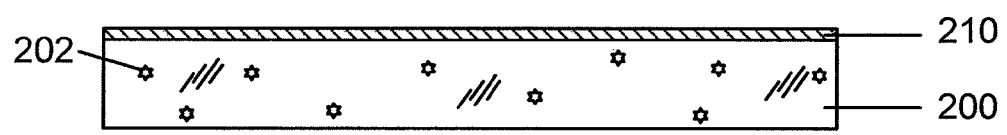

A Process 1020, a barrier material is formed overlying the surface region of the soda lime glass substrate. As seen visually in FIG. 3, in a specific embodiment, the barrier material 210 is formed overlying on the surface region 201 of the soda lime glass substrate 200. As mentioned earlier, the soda lime glass contains certain concentration of Na ions. These sodium species 202 especially at elevated temperatures can diffuse out of the surface regions of the glass, either into a next film material overlaid there as a first scenario or into an open environment as a second scenario. The barrier material 210 is applied to prevent Na ions from the soda lime glass substrate from diffusing into a to-be-formed metallic film overlying the glass substrate to cause corrosion or other damage to the film structure further into absorber material without control. In a specific embodiment, the barrier material 210 is selected from silicon dioxide, silicon nitride, or silicon oxynitride to serve as a diffusion barrier. The barrier material 210 can be formed using physical deposition, chemical deposition, sputtering, or other techniques. More details about controlling the sodium species directly from soda lime glass into the electrode material and absorber material will be found in later sections of the specification.

Figure 4:
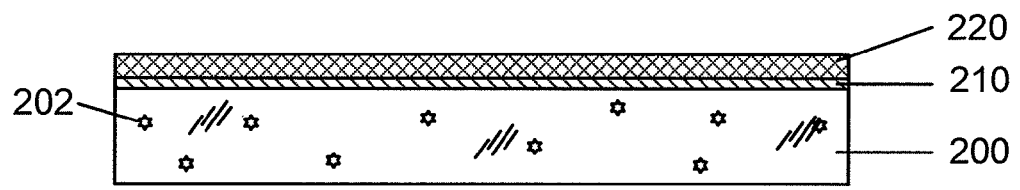
Figure 10:
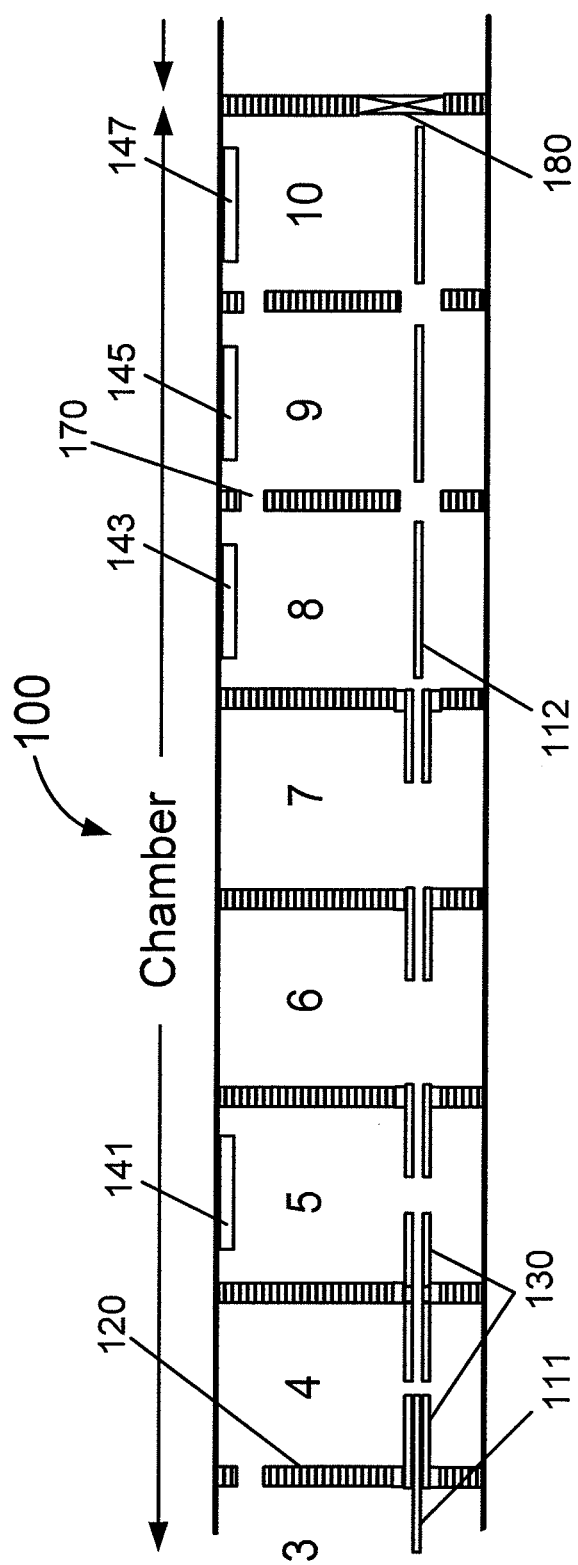
FIG. 10 is a schematic cross-section side view of an in-line chamber for depositing sodium bearing precursor materials for forming photovoltaic absorber materials according to an embodiment of the present invention.

Next process, Process 1030, of the method 1000 provided in the present invention, includes forming an electrode material overlying the barrier material. This is illustrated in FIG. 4, the electrode material 220 is formed overlying the barrier material 210. In a specific embodiment, the electrode material 220 is a metallic material comprising molybdenum (Mo) material. The molybdenum material can be formed using one or more deposition processes. For example, the molybdenum material can be deposited using sputter technique in a vacuum chamber. The vacuum chamber, in one implementation, can be set up as an in-line configuration where several compartments are built separated by dividers, as shown in FIG. 10. The substrate can be transferred via a transport device from one compartment to another via slits in the dividers. The vacuum chamber can use any one compartment to perform one or more deposition processes including sputtering formation of the electrode material 220. For example, in one compartment, a sputtering condition (pressure, power, and time) can be set to deposit a film of Mo material with compressive stress and another compartment can be controlled to deposit another film of Mo material with tensile or less compressive stress to make the final electrode material 220 with desirable mechanical property for bonding and further being patterned to form lower electrodes for the to-be-formed thin-film photovoltaic cells. The deposition of Mo material can be performed at relative low temperature (near room temperature). The Na ions 202 in soda lime glass are basically stayed within the substrate.

Figure 5:
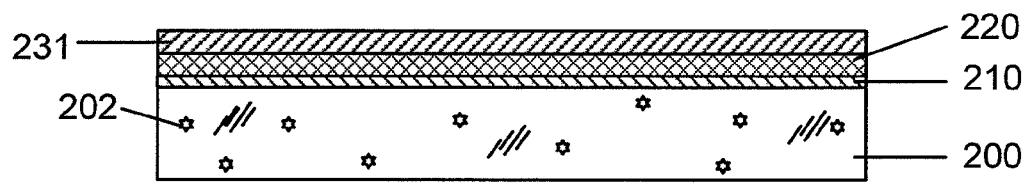

Referring to FIG. 1, the method 1000 according to the present invention further includes Process 1040, for sputtering a first target device including a first mixture of a copper species, gallium species, and a first sodium species to form a first precursor material overlying the electrode material. As shown in FIG. 5, a first precursor 231 is formed over the metallic electrode 220. This diagram is merely an example, which should not unduly limit the scope of the claims herein. One of ordinary skill in the art would recognize many variations, alternatives, and modifications. In an embodiment, the deposition is a DC magnetron sputtering process carried in one compartment of an in-line vacuum chamber. The target device disposed in the compartment includes a predetermined sodium composition and predominant amount (about 90 wt %) of copper-gallium species. The use of predominant copper-gallium species is based on one or more considerations for forming copper-based precursors following the formation of sodium bearing material for the manufacture of copper-based photovoltaic materials.

In an embodiment, the sodium species in the target device is included as ionic form in a compound $Na_2SeO_3$ species. For example, the sodium bearing target device includes $Na_2SeO_3$ species ranged from 4 wt % to 12 wt % and copper-gallium species from 88 wt % to 96 wt %. In a preferred embodiment, the sodium bearing target device is made of about 8 wt % of $Na_2SeO_3$ species and about 92 wt % of copper-gallium species. Furthermore, within the target device between the copper species and gallium species copper is dominant with >80 at % in composition. In an example, the Cu:Ga composition ratio is 80:20 (in terms of atomic concentration). In another example, the Cu:Ga ratio is 85:15. Other ratio values in between are also applicable. In the target device mentioned above, Na species itself in the first target device has 2-3 wt % concentration overall.

In another embodiment, sodium species in the first target device is contained as compound $Na_2Se$. For example, the composition of $Na_2Se$ species in the first target device ranges from 3 wt % to 9 wt % and copper-gallium species ranges from 91 wt % to 97 wt %. Similarly, the first target device overall contains about 2-3 wt % of Na species. In an implementation, a sputtering process can be carried out in one of compartments in the in-line chamber. The compartment for conducting the sputter deposition from the first target device is pre-pumped down to a pressure in a range of a few mTorr before filling work gases including Argon gas and/or Nitrogen gas. In a specific embodiment, the sputtering process is initiated via DC magnetron with a power of 1.5 kW or higher. For example, a 1.75 kW power is applied for depositing a film of the first precursor material from the sodium bearing first target device with Argon gas flow rate of about 200 sccm is used for controlling deposition rate throughout the deposition process. In particular, the sputter deposition is monitored by a thickness sensor near the front surface region of the substrate. The deposition is stopped when a first thickness of the first precursor material is reached. Correspondingly, with the use of the first target device and the sputtering condition, a sodium area density associated with the deposition rate is determined within in the first thickness of the first precursor material to be in a range of 0.03 to 0.09 micromoles/cm$^2$, a preferred first source of sodium species for manufacturing a high efficiency thin-film photovoltaic absorber material.

In a specific implementation, the first precursor material formed by the sputter deposition has a film thickness of about 60 nm. The first precursor material deposited overlying the electrode material includes at least sodium species, selenium species, copper species, and gallium species, in particular with about 90 wt % or more Cu—Ga species overall and with copper-gallium relative composition ratio of about 85:15. The selection of the first target device to provide dominant Cu—Ga species within the first thickness of the first precursor material serves as a structure base for subsequent addition of copper-gallium materials without inducing much interface stress. Without adding further sodium species from the target device, the subsequent addition of copper and gallium species need to be provided for achieving a desired copper and/or gallium composition in the to-be-formed photovoltaic absorber material.

Figure 6:
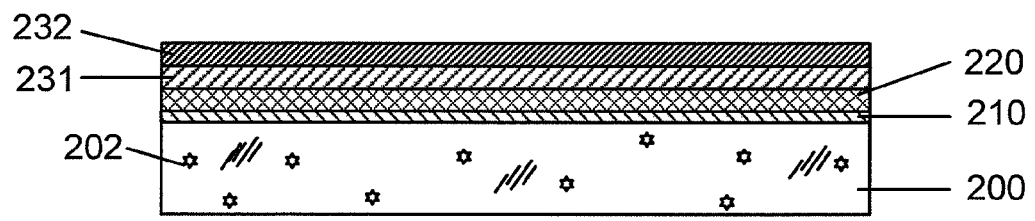

Referring to FIG. 1 again, the method 1000 further includes Process 1050 for sputtering a second target device including a second mixture of a copper species and a gallium species to form a second precursor material. Process 1050 is illustrated in FIG. 6. As shown, the second precursor material 232 is formed overlying the first precursor material 231. In an embodiment, Process 1050 is executed by a sputter deposition from a copper-gallium target device in another chamber to deposit a second thickness of the second precursor material 232. In an implementation, the second target device, i.e., the copper-gallium target device, contains 99.9% pure copper-gallium alloy. Within the second target device, the copper-gallium composition ratio is selected to have a comparable and lower copper-gallium composition ratio than the first target device. For example, the first sodium bearing target device includes about 92 wt % of copper-gallium species having a composition ratio ranging from 80:20 to 85:15. The second copper-gallium target device correspondingly has a copper-gallium composition ratio substantially equal to 75:25 (i.e., 75% Cu, 25% Ga). The composition ratio difference between the first and second target devices is small to avoid inducing potential interface lattice stress to cause film cracks so that the second precursor material can grow more smoothly overlying the first precursor material.

In an alternative embodiment, process 1050 is performed in a different compartment of the same in-line chamber used for depositing the first precursor material. The soda lime glass substrate 200, containing a stack of films formed in earlier processes including barrier material, electrode material, and the first precursor material, can be transferred from one compartment to another through one or more slits built in a lower portion of compartment dividers, as shown in FIG. 10. Argon gas can be used again as the work gas again for the sputtering process to form the second precursor material. The work gas can be distributed into the specific compartment through one or more windows built on the top portion of compartment dividers. DC magnetron sputtering technique is performed with target power set at about 4±1 kW and Argon gas flow rate set at about 170 sccm to control deposition rate of Cu—Ga species.

In an example, the second precursor material 232 is deposited up to a predetermined second thickness controlled by a thickness sensor. In a specific embodiment, the second thickness is predetermined to be about twice of the first thickness of the first precursor material. For example, the first thickness of the first precursor material includes copper-gallium species with some sodium species doped is about 60 nm. The subsequent second precursor material containing copper-gallium species only is added with the second thickness of about 120 nm. The corresponding mole density for CuGa species associated with the second precursor material is ranged from 1.5 to 2 micromoles/cm$^2$.

The deposition rate is controlled by adjusting the work gas flow rate with a fixed DC power level. Before deposition starts, the compartment is at least pre-conditioned to a vacuum environment at about 5 mTorr and less. Additionally, the compartment can be further supported by adding a cryogenic pump or a polycold system for attracting water vapor to reduce moisture damages to the sodium bearing first precursor material formed in last process. Furthermore, the sputter deposition is performed under suitable substrate temperatures such as about 20 Degrees Celsius to about 100 Degrees Celsius according to a specific embodiment. The Process 1050 of the method 1000 partially leads to a formation of a stack structure containing precursor materials for a formation of a copper-based thin-film photovoltaic absorber material. Further development of the stack structure of precursor materials can be found in more detail below.

Figure 7:
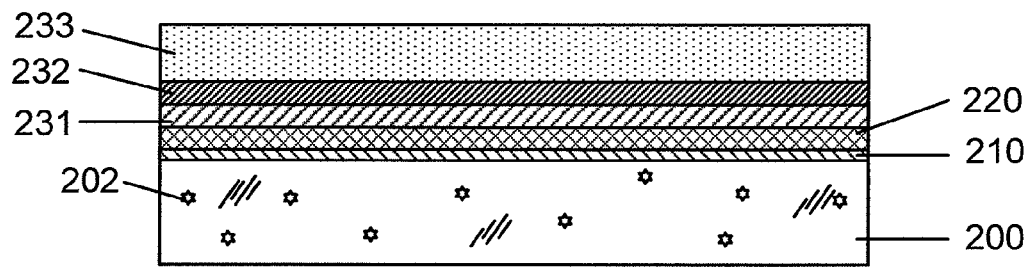

In next process (1060), the method 1000 includes sputtering a third target device including an indium species to form a third precursor material, resulting in a stack structure of the first, second, and third precursor material. This process can be visually illustrated by FIG. 7. FIG. 7 is a simplified diagram illustrating a third precursor material being deposited over the second precursor material according to an embodiment of the present invention. This diagram is merely an example, which should not unduly limit the scope of the claims herein. One of ordinary skill in the art would recognize many variations, alternatives, and modifications. As shown, the third precursor material 233 is substantially a pure indium film formed overlying the second precursor material 232 comprising copper-gallium alloy species. In an implementation, the third indium target device containing substantially high purity indium species up to 99.99%. DC Magnetron sputtering is applied in this process to deposit the third precursor material 233 up to a third thickness. In an embodiment, the third indium target device is disposed in a separate compartment next to the compartment used for depositing the second precursor material 232 within the same in-line chamber. The sputtering work gas can be Argon gas, which is released into the corresponding compartment through the windows disposed on top portion of dividers of the compartments. The current compartment may be located near an end portion of the in-line chamber for forming the stack structure of the precursor materials. In another embodiment, the current compartment may be located next to an entry port of another in-line chamber for different thin-film deposition, patterning, or thermal treatment processes. A valve device is added at the divider to ensure the current in-line chamber in proper vacuum condition isolated from ambient or a neighboring compartment of another in-line chamber.

The deposition of the third thickness of the third precursor material in process 1060 leads at least to a completion of the stack structure of the first, second, and third precursor materials. The third thickness is a factor used to monitor the deposition of the indium material, controlled by adjusting Argon gas flow rate and power level applied to the third target device. In order to control a stoichiometry of the stack of precursor materials a characterized composition ratio between copper species and sum of indium species plus gallium species (both of them belongs to VI group), namely a CIG composition ratio, is defined. In an example, the Ar flow rate is set to about 100 sccm and the DC power used for sputtering is about 9.2 kW. Accordingly, the associated indium deposition rate determines a mole density of the indium material 233 about 1.84 micromoles/cm$^2$. In another example, the first precursor material containing sodium bearing Cu—Ga species and the second precursor material containing pure Cu—Ga species have been formed with a combined thickness of about 180 nm. Correspondingly the third precursor material, i.e., indium material, deposited at Process 1060 has a thickness of about 290 nm.

Therefore, using three separate sputter deposition processes at a relative low temperature ranging from nearly room temperature to less than 100° C., the stack structure of the precursor materials are formed distinctly one-over-another with the first thickness, second thickness, and third thickness of respective precursor materials. The first precursor material is a copper-gallium material containing a first source of sodium species from a target device with a fixed concentration (e.g., 8 wt %) of $Na_2SeO_3$ species. The second precursor material is a substantially pure copper-gallium alloy with an atomic composition ratio substantially equal to a copper-gallium composition ratio in the first precursor material. The third precursor material is substantially pure indium material. In a specific embodiment, the resulted CIG ratio among the stack structure is in a range of 0.85 to 0.95.

Figure 8:
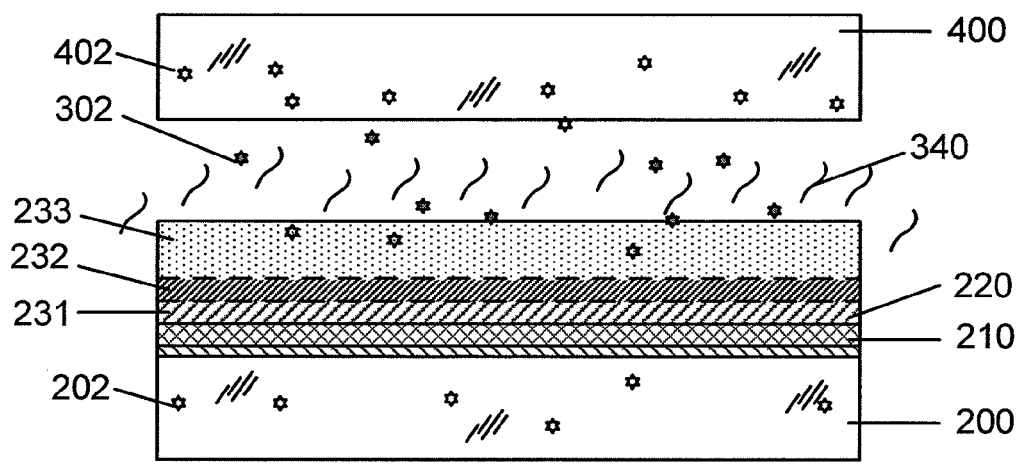

Referring again to FIG. 1, the method 1000 further includes a thermal treatment process (Process 1070) for subjecting the soda lime glass substrate having the stack structure in a furnace system with $H_2Se$ gas species and nitrogen species at a temperature above 400° C. to cause formation of an absorber material bearing the first sodium species. This process can be visually illustrated by FIG. 8 and FIG. 9. FIG. 8 shows a schematic diagram illustrating a process for subjecting the soda lime glass substrate with the stack structure of precursor materials to a thermal treatment according to an embodiment of the present invention. This diagram is merely an example, which should not unduly limit the scope of the claims herein. One of ordinary skill in the art would recognize many variations, alternatives, and modifications. As shown, the glass substrate 200 with at least the stack structure of precursor materials formed on the front surface region of the substrate is subjected a thermal treatment 340 within an isolated environment. The stack structure includes the first precursor material 231, the second precursor material 232, and the third precursor material 233, is exposed to the isolated environment containing one or more kinds of reactive work gases and subjected to externally-supplied thermal energy.

In a specific embodiment, the isolated environment can be a furnace system enclosing a volume of space filled the work gases. Particularly, the work gases are reactive to the ingredients within the stack of precursor materials, especially when the thermal energy is supplied to raise temperatures above 400° C. in the furnace system. In a specific embodiment, the work gases include a gaseous selenium species or alternatively a gaseous sulfur species. In an implementation, hydrogen selenide ($H_2Se$) gas is supplied in a first part of time period for performing thermal treatment and hydrogen sulfide ($H_2S$) gas is supplied during a second part of time period for performing the thermal treatment. Provided with elevated temperatures above 400° C. following a pre-determined profile in the furnace system, copper species, indium species, and gallium species in the stack structure of the precursor materials would like to react with the selenium and/or sulfur species in the work gases to induce a plurality of structural transformation within the stack structure and growth of polycrystalline grains. At the same time, the supplied thermal energy also helps enhancing interdiffusion of materials including copper species, indium species, gallium species, sodium species, and selenium/sulfur species across all the first thickness 231, the second thickness 232, and the third thickness 233 of the stack structure. As a result shown in FIG. 9, the thermally induced chemical reaction between the precursor materials and the gaseous selenium and/or sulfur species and atomic interdiffusion within the stack structure cause a transformation of the stack structure of respective precursor materials into a photovoltaic absorber material 500. The absorber material 500 is characterized by a chalcopyrite structure bearing polycrystalline grains of copper-indium-selenide (CIS), copper-indium-gallium-selenide (CIGS), or copper-indium-gallium-sulfur-selenide (CIGSS) compound materials. In an embodiment, the sodium species inside the stack structure, originated from a first source of sodium species in the first sputter target device, is able to diffuse through the stack structure and play its role to help the crystallized grains to grow in size and be stabilized. Larger polycrystalline grains with CIS/CIGS/CIGSS phases in the photovoltaic absorber material 500 play important role in enhancing photo energy conversion efficiency of the thin-film photovoltaic cell. In an alternative embodiment, the work gas used for the thermal treatment process is elemental selenium in vapor phase. In yet another embodiment, the work gas may include certain amount of nitrogen gas mixed with gaseous selenium species.

Additionally, the method 1000 includes process 1080 for transferring a second sodium species from a portion of the soda lime glass substrate via a gas-phase diffusion during the formation of the absorber material. This process also is visually illustrated by FIG. 8 and FIG. 9. As shown in FIG. 8, a second soda lime glass substrate 400 is disposed to have its back surface region within a substantially close distance from the stack structure formed on a front surface region of a first soda lime glass substrate 200. The furnace system is configured to load a plurality of substrates for the thermal treatment process. The first soda lime glass substrate 200 is just one of the plurality of substrates and the second soda lime glass substrate 400 can be a nearest neighbor of the first soda lime glass substrate 200 and is disposed specifically in a configuration to allow a bare back surface region of the substrate 400 to face the stack structure of precursor materials on the front surface regions of the substrate 200. In an embodiment, the substrate 400 includes a front surface region on which a stack structure of precursor materials on an electrode material overlying a barrier material are formed, substantially similar to the first soda lime glass substrate 200. The second soda lime glass substrate 400 itself also contains a certain percentage of sodium species 402 in an ionized form $Na^+$. As temperatures in the furnace system are raised, a portion of the $Na^+$ species 402 is able to diffuse out of the back surface region of the substrate 400. As these $Na^+$ species 402 in the open space between the two substrates, $Na^+$ species react with $H_2Se$ gas species within the heated furnace system to form an intermediary species of $Na_2Se$ 302, which are substantially in a gas phase. The gas phase $Na_2Se$ species 302 continue diffusing and reaching a top surface region of the stack structure of precursor materials associated with the first substrate 200. From the top surface region the sodium $Na^+$ ions of the $Na_2Se$ species 302 is absorbed by the precursor materials that are just in a process involving chemical reactions with the work gases and atomic interdiffusion within the stack structure subjected to the same chemical and thermal environment in the furnace system. These Na+ ions provide a second source of sodium species that are incorporated into the stack structure of precursor materials to contribute the transformation of the stack structure of precursor materials 231, 232, and 233 into the polycrystalline grains of a photovoltaic absorber material 500. The second sodium species from the gas-phase diffusion and the first sodium species directly from sputtering target device are combined to give a total doping level of sodium species 502 inside the CIS/CIGS/CIGSS-based thin-film photovoltaic absorber material 500 formed during the thermal treatment at temperatures over 400° C. In a specific embodiment, the CIS/CIGS/CIGSS-based thin-film absorber material contains a preferred copper-to-indium+gallium ratio of about 0.9 and a sodium concentration ranged from 0.7 wt % to 1.2 wt %. As a result, a solar module based on a single junction of the CIS/CIGS/CIGSS-based thin-film photovoltaic absorber material according to embodiments of the present invention can be made with a solar energy conversion efficiency as high as 15% or more.

Figure 9:
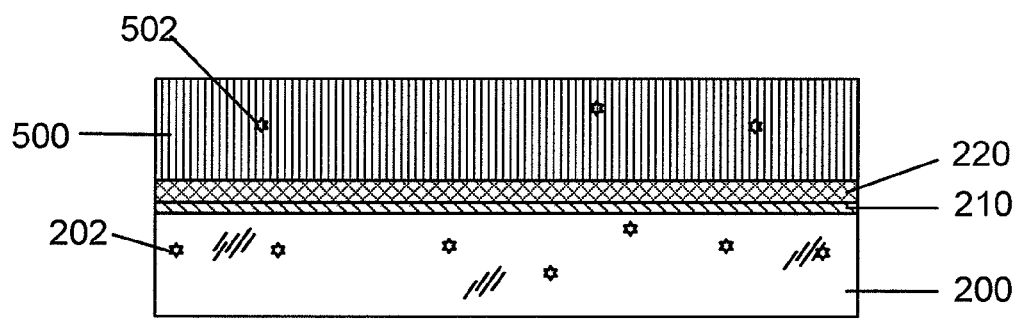

The above sequences of processes provide a method of fabricating a thin-film photovoltaic device monolithically on a soda lime glass substrate according to a specific embodiment of the present invention. Of course, there are many variations, alternatives, and modifications. For example, the thermal energy supplied during the thermal treatment 340 is provided via a heating system associated with the furnace system. The heating system with control is able to ramp up temperature in the furnace system from room temperature to 600 Degrees Celsius in several quick ramping stages. The heating system also is able to withhold temperature nearly constant during one or more dwelling stages for conducting the reactive thermal annealing within a desired temperature range. For example, one dwelling stage is associated with a treatment in $H_2Se$ gaseous environment at about 430° C. for about 1 hour or longer and another dwelling stage is associated with a treatment in $H_2S$ gaseous environment (with $H_2Se$ substantially removed) at about 520° C. for about 40 minutes or shorter. The heating system includes radiation heating mechanism, force convection mechanism, and cooling mechanism for achieving fast ramping, stable dwelling, and quick cooling characteristics of the temperature profile designated for the thermal treatment of the stack structure of respective precursor materials on the soda lime glass substrates. More details about the temperature profile and advanced control associated with the thermal treatment in the furnace system can be found in U.S. patent application Ser. No. 61/432,775, filed in Jan. 14, 2011, commonly assigned and incorporated as a reference for all purposes. One or more processes may be added, inserted, replaced, or altered in order for accomplishing the transformation of the precursor materials into the photovoltaic absorber. As shown in FIG. 9, the thermally induced reaction and atomic inter-diffusion cause a transformation of the stack of precursor materials to a CIS/CIGS/CIGSS-based photovoltaic absorber material 500, wherein a small percentage of sodium species 502 is doped. The photovoltaic absorber material 500 just formed can be further used to manufacture a monolithically integrated thin-film solar module on the same soda lime glass substrate 200.

FIG. 10 is a schematic cross-section side view of an in-line chamber for depositing a sodium bearing composite precursor material for forming photovoltaic absorber materials according to an embodiment of the present invention. This diagram is merely an example, which should not unduly limit the scope of the claims herein. One of ordinary skill in the art would recognize many variations, alternatives, and modifications. As shown in a specific embodiment, the substrate 111 can be loaded into a chamber 100. Particularly, the substrate 111 is a planar substrate and is firstly disposed in a compartment, for example, compartment 4, where an oxide barrier can be formed overlying a surface of the substrate. Following that, the substrate 111 can be moved to a next compartment (#5) through a slit 130 built in a divider 120. In the compartment 5 a metallic material can be deposited overlying the oxide barrier using a target device 141 disposed therein. The metallic material is used to form an electrode of to-be-formed photovoltaic cells. In particular, the substrate having the metallic material can be patterned and configured to form electric contacts and add cell-cell insulation and external links. These and other processes can be formed in subsequent compartments within the in-line chamber 100.

In one or more embodiments, substrate 112 including a pre-formed metallic electrode layer is loaded in a compartment, for example, compartment #8, ready for the formation of one or more precursor materials. Firstly, a first precursor material is formed with a composite material containing cooper, gallium, and sodium species overlying the metallic electrode using a sodium-bearing CuGa target device 143 via a DC Magnetron sputtering process. In an embodiment, the sodium-bearing CuGa target device 143 comprises about 8 wt % of $Na_2SeO_3$ and 92 wt % of Cu—Ga alloy. The Cu:Ga composition ratio within the sodium-bearing CuGa target device 143 is ranged from 80:20 to 85:15. The compartment #8 can be filled with Argon gas (and mixed with certain amount of nitrogen) as sputter work gas. The flow rate of Argon gas ranging from 190-250 sccm is used for controlling deposition rate. The substrate can be held at near room temperature and the target power is set to be between 1.2 to 1.8 kW.

Next, a formation of a second precursor material can be started as the substrate 112 is transferred to the next compartment (#9), where a CuGa target device 145 is disposed for sputtering a copper-gallium material overlying the first precursor material. The CuGa target device 145 can be made of a pure (99.9%) Cu—Ga alloy material and an applied power is set to be 3.5 to 4.5 kW. The Argon gas is also used as work gas which can be led into compartment 9 via a window 170 built in the divider 120 separating the compartment #8 and #9. Flow rate of Argon gas into the compartment #9 can be reduced to about 170 sccm to control the copper-gallium deposition rate.

Furthermore, a third precursor material can be formed as the substrate 112 is transferred into next compartment #10 where an indium target device 147 is disposed for performing sputter deposition of an indium layer. The indium In target contains substantially pure (99.99%) indium In material and is applied about 9 kW or higher for conducting sputtering. Again Argon gas flow is adjusted to about 100 sccm for controlling depositing rate of the indium material. As the substrate is about to be transferred out of the in-line chamber 100, a stack structure of respective precursor materials including a sodium bearing copper-gallium material, a copper-gallium material, and an indium material is formed. Of course, there can be many variations, alternatives, and modifications. For example, the target power levels, and work gas flow, target compositions, and other process conditions can be adjusted for sputtering the precursor materials, although the target composition, target power, flow rate are specifically mentioned above according to embodiments of the present invention.

In an embodiment, the substrate 112 can be further transferred out from the in-line chamber 100 and then loaded to another chamber or furnace for subjecting at least the composite precursor material to a thermal treatment (e.g., Process 1070). In an implementation, the substrate transfer can be performed without breaking vacuum between the in-line chamber 100 and the next chamber for thermal treatment, simply through a controlled valve 180. Of course, depending on applications, there can be certain variations, modifications, and alternatives.

Figure 11:
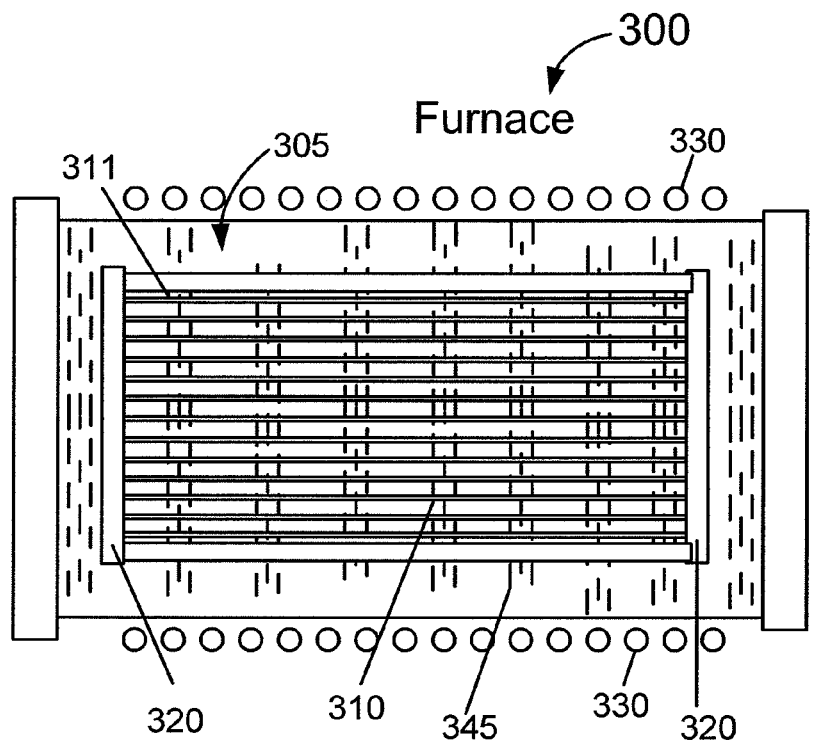
FIG. 11 is a schematic diagram of a furnace system for treating precursor materials on soda lime glass substrates for the formation of photovoltaic absorber materials according to an embodiment of the present invention.

In an alternative embodiment, the next chamber next to the chamber 110 can be a furnace system equipped with a heating device, a circulation device, and a cooling device and enclosed with a spatial volume supplied with a gaseous chemical environment. FIG. 11 is a schematic diagram of a furnace system for thermally treating the precursor materials and transforming the precursor materials incorporated with one or more sources of sodium species to a photovoltaic absorber material according to an embodiment of the present invention. This diagram is merely an example, which should not unduly limit the scope of the claims herein. One of ordinary skill in the art would recognize many variations, alternatives, and modifications. As shown, the furnace system 300 can be a tubular shaped container having a heating/cooling device 330 surrounded a spatial volume 305 where a plurality of substrates 310 bearing a stack structure of precursor materials on one surface region are loaded in a holding device 320. The holding device 320 also includes a forced convention gas circulation device (not explicitly shown) for enhancing temperature uniformity. The spatial volume 305 is then filled with a gaseous species 345 containing at least gaseous selenium species in one time period or gaseous sulfur species in another time period for conducting a selenization and/or a sulfurization of the precursor materials in the stack structure and also inducing a thermal diffusion of sodium within the stack structure as well as a gas phase diffusion from the soda lime glass into the stack structure.

Figure 11A:
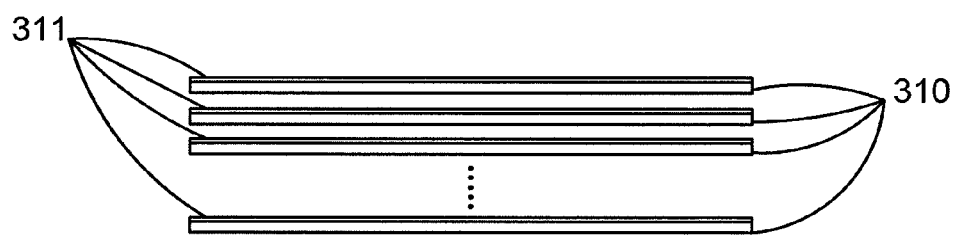
FIG. 11A is a schematic configuration diagram of a plurality of soda lime glass substrates disposed within the furnace system in FIG. 11 according to a specific embodiment of the present invention.

In a specific embodiment, the thermal reactive treatment process in the furnace 300 is carried at a variable temperature environment capable ramping up from room temperature to about 600 degree Celsius. The heating device 330 can be configured to ramp up the temperature with a desired rate and control the temperature to a suitable annealing range within a small variation across entire area of each substrate. In a specific embodiment, the thermal reactive treatment process is carried out in an environment comprising hydrogen selenide gas for the selenization process of the precursor materials including at least copper, indium, and gallium species. The thermal treatment is substantially a reactive annealing and inter-diffusion process during which the copper, gallium, and indium species in the stack structure to react with the gaseous selenium species and at the same time cause the sodium species in the first precursor material to diffuse throughout the stack structure including additionally the second and third thickness of precursor materials. In another specific embodiment, the thermal treatment process is further carried out in an environment comprising gaseous sulfur species for an additional sulfurization process of these precursor materials. In yet another specific embodiment, the thermal treatment further causes a second sodium species to diffuse out of the soda lime glass and react with selenium species in the spatial volume to form an intermediary species of $Na_2Se$. The intermediary species of $Na_2Se$ is a gas phase species that further diffuse toward the surface region of the top-most precursor material of the stack structure. The sodium ions in the intermediary species of $Na_2Se$ are absorbed into the stack structure as a second source of sodium species incorporated in the precursor materials to help the formation of photovoltaic absorber material. In a preferred embodiment, as shown in FIG. 11A, a plurality of soda lime glass substrates 310 that bears the stack structure of precursor materials on respective front surface region 311 is disposed in a configuration one next to another in parallel so that each stack structure on the front surface region 311 is facing directly to a back surface region of a neighboring soda lime glass substrate 310. This configuration, in particular with one substrate being disposed in a substantially close distance to another, is designated to facilitate the gas phase diffusion of the second sodium species from a soda lime glass substrate into the stack structure of precursor materials on a neighboring substrate. Of course, there are many other variations, alternatives, and modifications.

In certain embodiments, non-reactive nitrogen gas is also mixed with the reactive selenium gas in the volume of space 305 for enhancing temperature uniformity of the substrates and adjusting the reaction rates. In another embodiment, suitable temperature profile is followed to perform the thermal treatment. The temperature profile includes heating the substrates from room temperature to one or more dwell stages with elevated temperatures and cooling back quickly. In an example, furnace temperature is ramped up to a first dwell stage at about 430±10 Degrees Celsius with a work gas containing selenium/nitrogen with a certain mix composition, then the temperature is held there for an annealing time period lasting about ½ hour to one hour. Then the work gas of selenium/nitrogen is pumped out to remove selenium species to substantially stop the reactive process. In certain embodiment, another work gas containing gaseous sulfur species is flowed in, for example, the $H_2S$ gas is added, during which the temperature is further ramped up to about 520 degree Celsius or even higher for additional annealing time period. During this period a sulfurization process occurs as selenium species inside the reacted precursor film has be extracted out or replaced by the gaseous sulfur species. As the result of the above-mentioned selenization and sulfurization processes, a composite film with polycrystalline chalcopyrite structured CIS/CIGS/CIGSS compound material is formed.

According to an embodiment of the present invention, during the formation of CIS/CIGS/CIGSS compound material both a first sodium species in the sodium bearing first precursor material and a second sodium species from the soda lime glass via a gas-phase diffusion are combined to play important roles in helping the growth of polycrystalline chalcopyrite structured grains. In particular, the sodium ions under a controlled doping concentration help the chalcopyrite grains to grow in relative large size up to a few microns. Without the assistance of sodium ions or with un-controlled excessive supply of sodium content, the chalcopyrite grains would become substantially finer, leading to a great reduction in photovoltaic current and degradation of the efficiency of the solar device. According to embodiments of the present invention, the sodium content can be well controlled using the in-chamber sodium sputter deposition process with a sodium bearing target containing a specific sodium species distributed within a host $Na_2SeO_3$ material mixed with copper and gallium materials. Also, a preferred sputter deposition condition is selected for achieving a desired mole density of sodium to ensure a controlled doping in the composite precursor material. Additionally, the gas phase diffusion of a second sodium species from the soda lime glass substrate during a predetermined thermal treatment process facilitates the transformation of the precursor material and the growth of the CIS/CIGS/CIGSS grains and provides final dose of sodium content required in the photovoltaic absorber material that results in high solar energy efficiency. Of course, there are many alternatives, variations, and modifications for performing sodium doping for forming the photovoltaic absorber material.

In an alternative embodiment, the thermal treatment process can be just a sulfurization process where the furnace system is held in an environment with a fluidic-phase sulfur bearing species. For example, the sulfur bearing species can be provided in a solution, which has dissolved $Na_2S$, $CS_2$, $(NH_4)_2S$, thiosulfate, and others. In another example, the fluidic sulfur bearing species can be hydrogen sulfide gas. As the result of these specific thermal treatment processes involving sulfide, a composite material containing copper indium gallium disulfide compound $CuIn(Ga)S_2$ or $CuInS_2$ also can be found in the absorber material.

Figure 12:
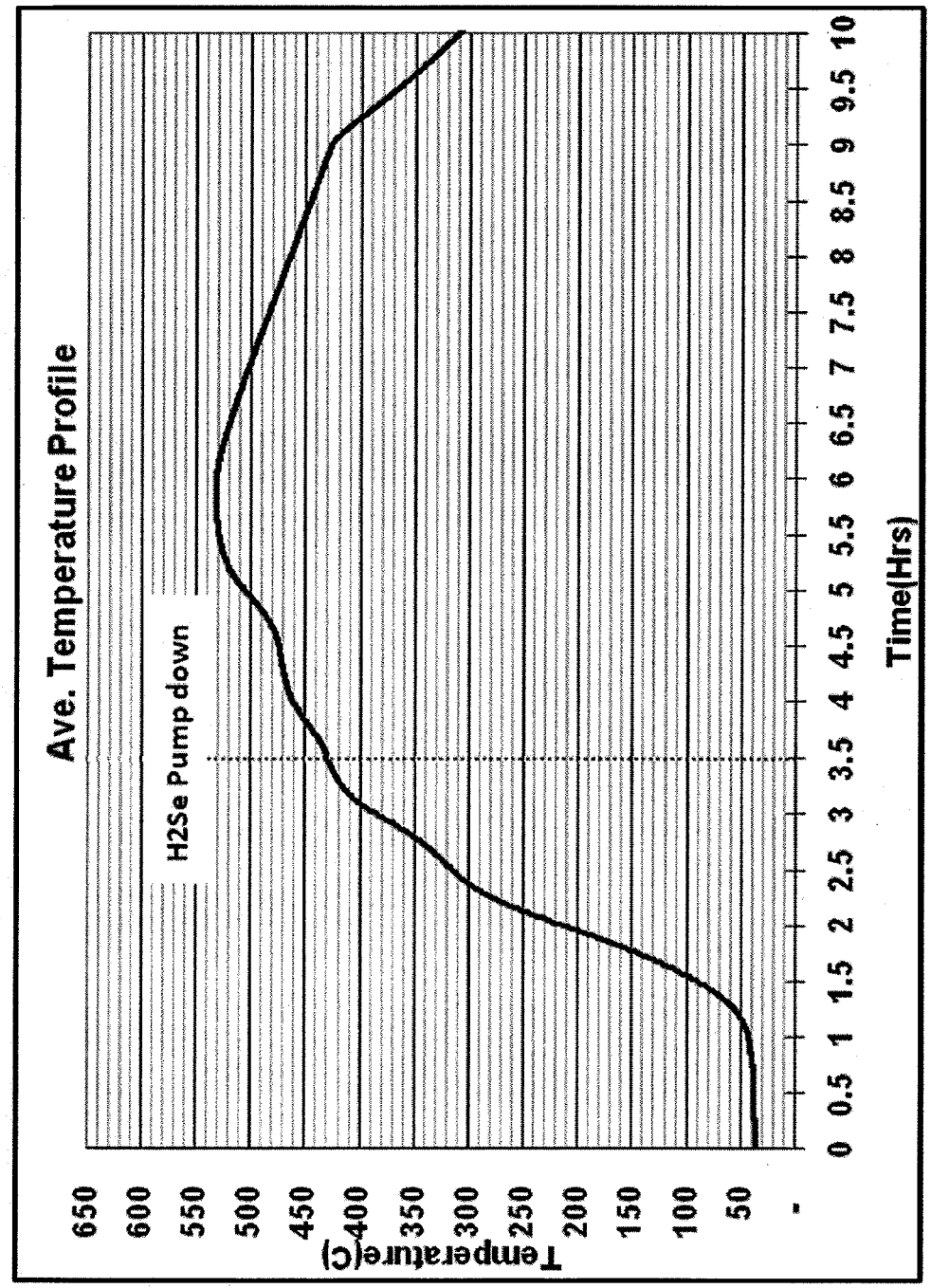
FIG. 12 is an exemplary average temperature profile diagram for forming photovoltaic absorber materials on soda lime glass substrates in the furnace system in FIG. 11 according to a specific embodiment of the present invention.

FIG. 12 is an exemplary average temperature profile diagram for forming photovoltaic absorber materials on soda lime glass substrates in the furnace system in FIG. 11 according to a specific embodiment of the present invention. This diagram is merely an example, which should not unduly limit the scope of the claims herein. One of ordinary skill in the art would recognize many variations, alternatives, and modifications. In this example, the thermal treatment process for transforming the stack of precursor materials into a photovoltaic absorber material on each soda lime glass is performed in the furnace system shown in FIG. 11 under a process temperature profile illustrated in FIG. 12. The stack of precursor material, according to an embodiment, is the first thickness, the second thickness, and the third thickness of precursor materials 231, 232, and 233 shown in FIG. 8. The furnace temperature is ramped up from room temperature to above 400° C. within about 3 hours. The furnace system is filled with a gaseous selenium species, for example, $H_2Se$ gas. Assisted by the thermal energy above 400° C. while the temperature continues to increase to about 430° C., selenium species react with the copper species, indium species, and gallium species in the stack of precursor materials to cause the formation of grains of CIGS or equivalent compound wherein a first source of sodium species thermally diffuses within the grain structure as a dopant. At the same time, a second sodium species from bottom surface of a neighboring soda lime glass substrate react with the selenium species in the furnace system to form an intermediary gas phase $Na_2Se$ species. The gas phase $Na_2Se$ species diffuse across a gap between the two glasses to land on top of the stack of precursor material that is just in a selenization process of chemical transformation of the precursor material into the photovoltaic absorber material. The $Na_2Se$ species is captured and further diffuse into the absorber material to provide a second source of sodium dopant. During the selenization process up to a max temperature around 430° C., there is no plateau at the max temperature before the $H_2Se$ gas is pump down at around 430° C.

After $H_2Se$ species is substantially pump down, $H_2S$ gas is filled in the furnace system. The furnace temperature immediately ramps up toward 500° C. after the $H_2S$ gas is filled to start a sulfurization process during which part of the selenium species is removed first form the film with CIGS or equivalent grains and sulfur species is incorporated in the film to form CIGSS grains. The temperature eventually reaches a maximum temperature about 530° C. and keeps a plateau for about 30 minutes before starting a cooling process, as seen in FIG. 12. The cooling process is firstly slow with a relative low rate to avoid retain large stress in the film due to glass transition. After the temperature drops below glass transition temperature 425° C., higher cooling rate is enforced to accelerate the cooling until the furnace system backs to a temperature below 100° C.

Figure 13:
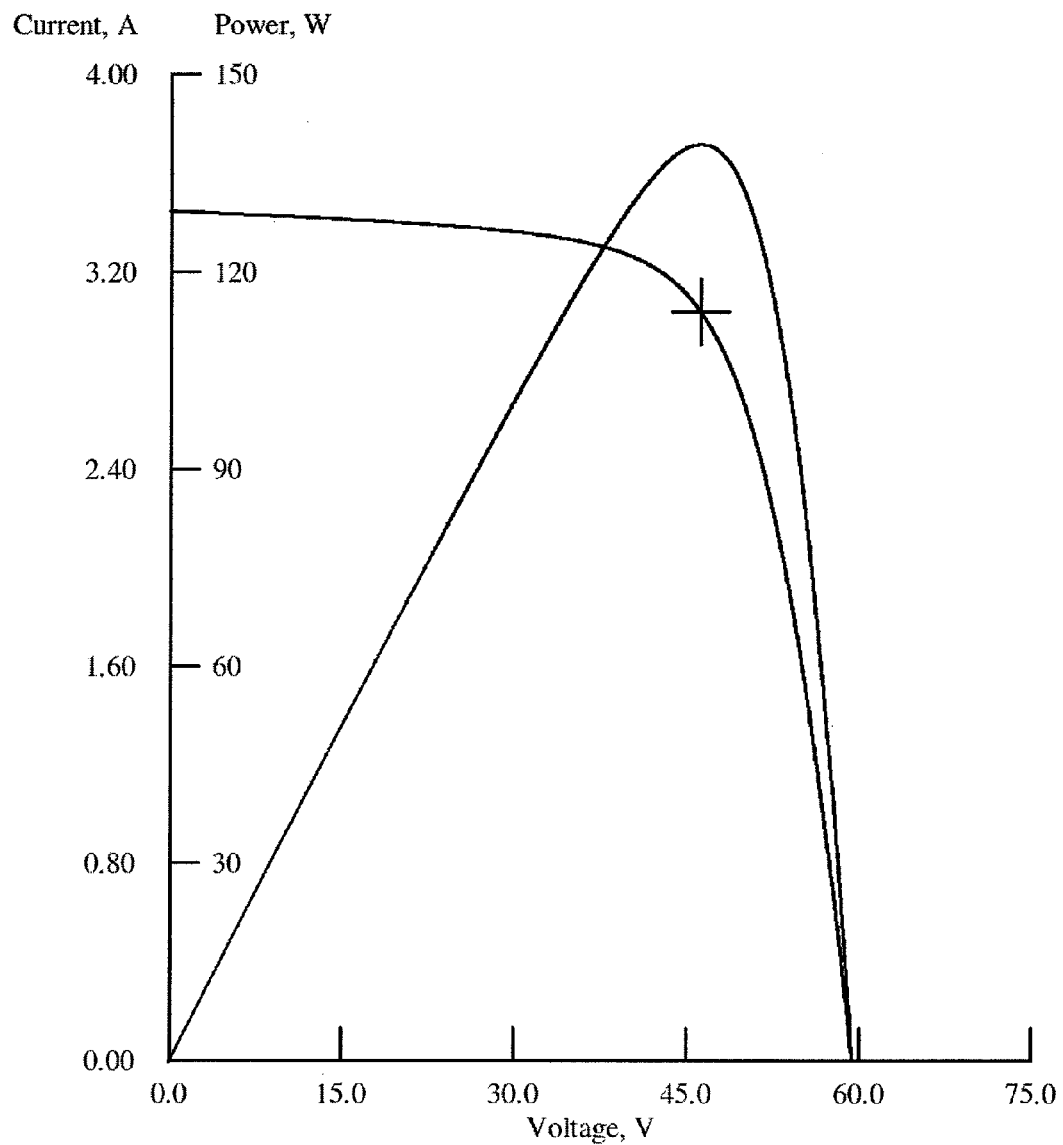
FIG. 13 is an exemplary IV characteristic diagram of a sample solar module based on the thin-film photovoltaic absorber material according to an embodiment of the present invention.

FIG. 13 is an exemplary IV characteristic diagram of a sample solar module based on the thin-film photovoltaic absorber material according to an embodiment of the present invention. This diagram is merely an example, which should not unduly limit the scope of the claims herein. One of ordinary skill in the art would recognize many variations, alternatives, and modifications. In this example, the sample solar module is made from a CIS/CIGS/CIGSS-based photovoltaic absorber material formed on a soda lime glass substrate having a form factor of 165 cm×65 cm. having an energy bandgap of about 1.05 eV. In this plot, the photo-electron current generated by the sample solar cell is plotted against bias voltage. Also the cell power (calculated) is plotted against the voltage. Based on the data and a standard formula, a cell conversion efficiency η can be estimated:

$$\eta = \frac{I_{SC} \cdot V_{OC} \cdot FF}{P_{in}(AM1.5)}$$

where $I_{SC}$ is the short circuit current of the cell, $V_{OC}$ is the open circuit bias voltage applied, FF is the so-called fill factor defined as the ratio of the maximum power point divided by the open circuit voltage ($V_{OC}$) and the short circuit current ($I_{SC}$). The fill factor for this module is 0.685. The input light irradiance ($P_{in}$, in W/m$^2$) under standard test conditions [i.e., STC that specifies a temperature of 25° C. and an irradiance of 1000 W/m$^2$ with an air mass 1.5 (AM1.5) spectrum.] and a product with an effective surface area of the solar module (about 0.96 m$^2$). The short-circuit current $I_{SC}$ is deduced to be about 3.448 A and the open circuit voltage $V_{OC}$ is measured to be about 59.024 V. This yields a module efficiency of as high as about 14.1% for the sample solar module. The photovoltaic absorber material of the solar module contains essentially sodium-doped CIGS/CIGSS grains where the Cu/InGa ratio is about 0.87 and sodium composition is about 0.99%.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of processing a thin film absorber material with enhanced photovoltaic efficiency, the method comprising:
   providing a soda lime glass substrate having a surface region;
   forming a barrier material overlying the surface region, the barrier material being configured to prevent a diffusion of sodium ions from the soda lime glass substrate;
   forming a back electrode which includes molybdenum over the barrier material;
   depositing a stack of precursor materials independently from several target devices made from copper species, gallium species, a sodium species, a copper-gallium alloy species, and an indium species, the sodium species including sodium ions from $Na_2SeO_3$ compound and/or $Na_2Se$ compound;
   subjecting the soda lime glass substrate having the stack of precursor materials to a thermal treatment in the presence of $H_2Se$ gas species and nitrogen species at a temperature above 400° C. to form an absorber material from interdiffusion of the copper species, the gallium species, the indium species, and the sodium ions and from reactive incorporation of selenium species from the $H_2Se$ gas species; and
   while doing so transferring a sodium species from at least a neighboring soda lime glass substrate.

2. The method of claim 1 wherein the barrier material is selected from silicon dioxide, silicon nitride, or silicon oxynitride.

3. The method of claim 1 wherein the step of transferring a sodium species comprises,
   reacting a sodium species from the soda lime glass substrate using the $H_2Se$ gas species to from an intermediary species of $Na_2Se$;
   transferring the $Na_2Se$ to the absorber material; and
   absorbing sodium from the $Na_2Se$ into the absorber material.

4. The method of claim 3 wherein the sodium has a concentration of $10^{18}$-$10^{19}$ atoms/cc in the absorber material.

5. The method of claim 3 wherein the intermediary species of $Na_2Se$ is a gas phase species.

6. The method of claim 3 wherein the absorber material includes from 0.7 at % to 1.5 at % of sodium.

7. The method of claim 3 wherein the absorber material includes an atomic ratio of copper species to indium species and gallium species at about 0.9.

8. The method of claim 1 wherein the step of subjecting the soda lime glass substrate and the stack of precursor materials comprises heating to a temperature from about 400° C. to about 600° C.

9. A method of incorporating sodium species into thin-film photovoltaic absorber for enhancing solar energy conversion efficiency, the method comprising:
   providing a plurality of soda lime glass substrates, each having a front surface region and a back surface region;
   forming a bottom electrode material overlying the front surface region of each soda lime glass substrate;
   forming a stack of precursor materials including copper, indium, gallium, and sodium, overlying the bottom electrode material at a first temperature range;
   disposing the plurality of soda lime glass substrates dispersedly one in parallel to another, each having the stack of precursor materials, to a furnace containing $H_2Se$ gas and nitrogen gas; and
   heating the plurality of soda lime glass substrates to a second temperature range to cause the precursor materials on each substrate to react with selenium from the $H_2Se$ gas to form a photovoltaic absorber material having sodium from the precursor materials and from one or more of the plurality of soda lime glass substrates.

10. The method of claim 9 wherein each of the plurality of soda lime glass substrates is a standard commercial soda lime flat glass with about 14 wt % of $Na_2O$.

11. The method of claim 9 wherein sodium from one or more of the plurality of soda lime glass substrates is provided in an intermediary species of $Na_2Se$ in gas phase.

12. The method of claim 9 wherein the first temperature range comprises a temperature range from about 20° C. to about 100° C.

13. The method of claim 9 wherein the second temperature range comprises a temperature range from about 400° C. to about 600° C.

14. The method of claim 9 wherein the photovoltaic absorber material comprises a copper-indium-gallium-selenium compound having sodium of about 0.7 at % to 1.5 at %.

* * * * *